United States Patent
Yamazaki et al.

(10) Patent No.: US 6,822,391 B2
(45) Date of Patent: Nov. 23, 2004

(54) LIGHT EMITTING DEVICE, ELECTRONIC EQUIPMENT, AND METHOD OF MANUFACTURING THEREOF

(75) Inventors: Shunpei Yamazaki, Tokyo (JP); Junya Maruyama, Kanagawa (JP); Keiichi Ogura, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 77 days.

(21) Appl. No.: 10/077,370

(22) Filed: Feb. 15, 2002

(65) Prior Publication Data

US 2002/0113549 A1 Aug. 22, 2002

(30) Foreign Application Priority Data

Feb. 21, 2001 (JP) ........................................ 2001-045627

(51) Int. Cl.$^7$ ................................................ H01J 1/62
(52) U.S. Cl. ...................... 313/512; 313/506; 313/500
(58) Field of Search ................................ 313/498–512; 427/66

(56) References Cited

U.S. PATENT DOCUMENTS

| | | |
|---|---|---|
| 5,107,175 A | 4/1992 | Hirano et al. |
| 5,124,204 A | 6/1992 | Yamashita et al. |
| 5,189,405 A | 2/1993 | Yamashita et al. |

(List continued on next page.)

FOREIGN PATENT DOCUMENTS

| | | |
|---|---|---|
| EP | 0 773 166 | 5/1997 |
| EP | 1 058 484 A1 | 12/2000 |
| JP | 5-069520 | 3/1993 |
| JP | 6-076948 | 3/1994 |
| JP | 8-053116 | 2/1996 |
| JP | 8-068990 | 3/1996 |
| JP | 08-068990 | 3/1998 |
| JP | 2000-188367 | 7/2000 |

OTHER PUBLICATIONS

English abstract re Japanese Patent Application No. JP 5–069520.

Full English translation re Japanese Patent Application No. JP 6–076948.

English abstract re Japanese Patent Application No. JP 8–053116.

English abstract re Japanese Patent Application No. JP 8–068990.

English abstract re Japanese Patent Application No. JP 2000–188367.

*Primary Examiner*—Nimeshkumar D. Patel
*Assistant Examiner*—German Colón
(74) *Attorney, Agent, or Firm*—Cook, Alex, McFarron, Manzo, Cummings & Mehler, Ltd.

(57) ABSTRACT

A highly reliable light-emitting device is provided in which an organic light-emitting device is not degraded by oxygen, moisture, and the like. The organic light-emitting device is press-fit in vacuum using a wrapping film (105) that is covered with a DLC film (or a silicon nitride film, an AlN film, a film of a compound expressed as $AlN_XO_Y$) (106) containing Ar. The organic light-emitting device thus can be completely shut off from the outside, and moisture, oxygen, or other external substances that accelerate degradation of an organic light emitting layer can be prevented from entering the organic light-emitting device.

23 Claims, 11 Drawing Sheets

U.S. PATENT DOCUMENTS

| | | | |
|---|---|---|---|
| 5,686,360 A | 11/1997 | Harvey, III et al. | |
| 5,693,956 A | 12/1997 | Shi et al. | |
| 5,731,048 A * | 3/1998 | Ashe et al. | 427/585 |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,952,778 A | 9/1999 | Haskal et al. | |
| 5,990,542 A | 11/1999 | Yamazaki | |
| 6,146,225 A | 11/2000 | Sheats et al. | |
| 6,150,187 A | 11/2000 | Zyung et al. | |
| 6,191,492 B1 * | 2/2001 | Yamazaki et al. | 257/787 |
| 6,198,217 B1 | 3/2001 | Suzuki et al. | |
| 6,198,220 B1 | 3/2001 | Jones et al. | |
| 6,268,695 B1 | 7/2001 | Affinito | |
| 6,274,887 B1 | 8/2001 | Yamazaki et al. | |
| 6,413,645 B1 | 7/2002 | Graff et al. | |
| 6,445,005 B1 | 9/2002 | Yamazaki et al. | |
| 6,537,688 B2 * | 3/2003 | Silvernail et al. | 428/690 |
| 6,605,826 B2 * | 8/2003 | Yamazaki et al. | 257/72 |
| 2002/0125817 A1 | 9/2002 | Yamazaki et al. | |
| 2002/0190257 A1 | 12/2002 | Yamazaaki et al. | |

* cited by examiner

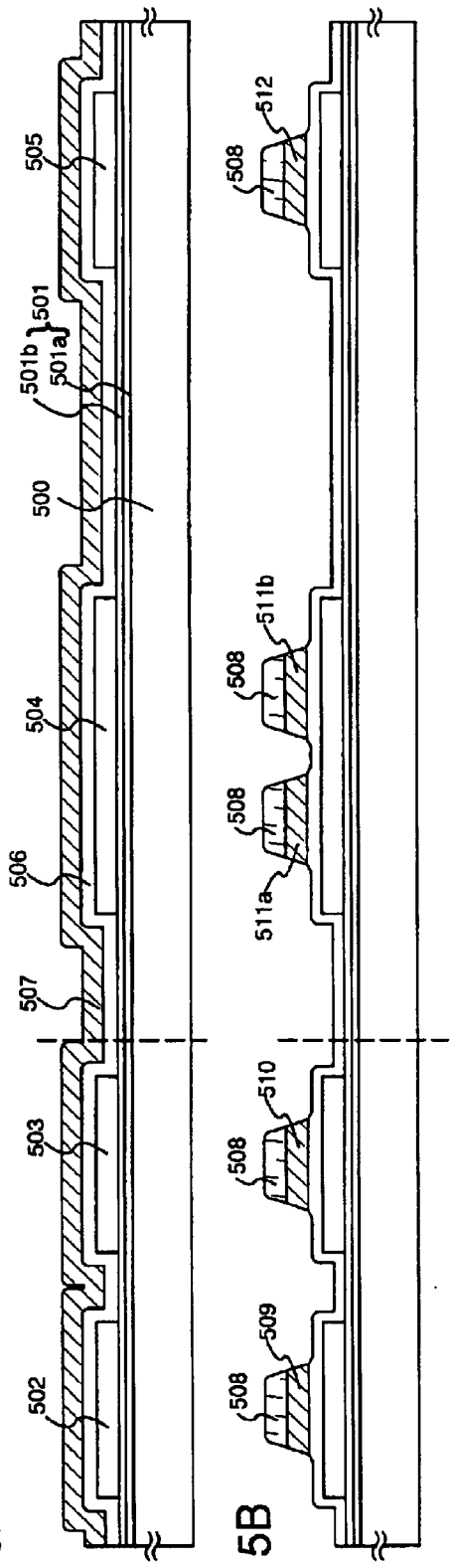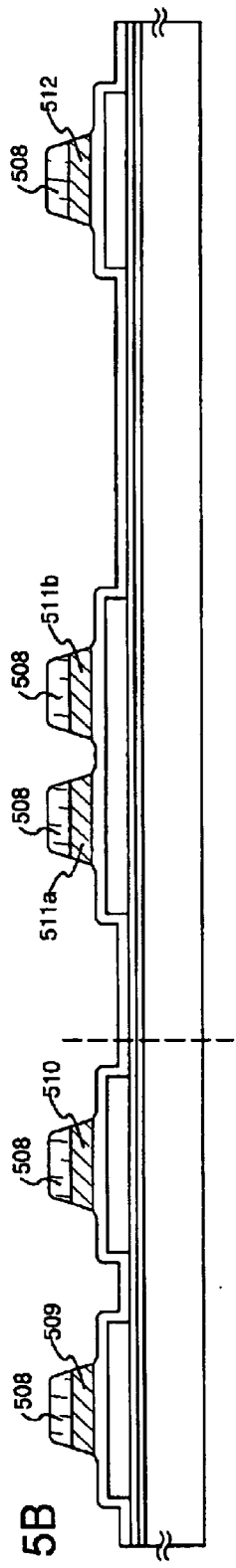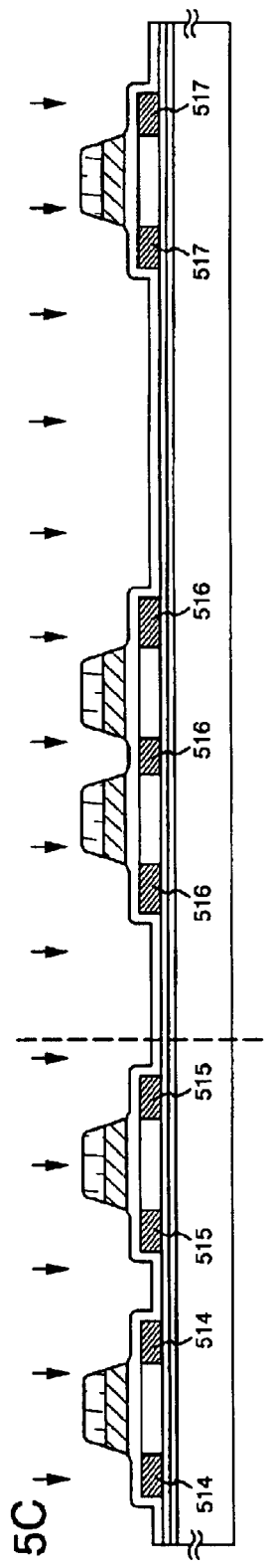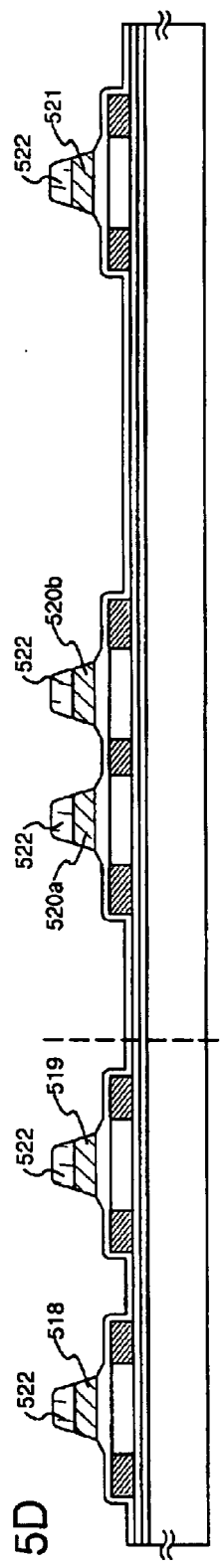
FIG. 5A
FIG. 5B
FIG. 5C
FIG. 5D

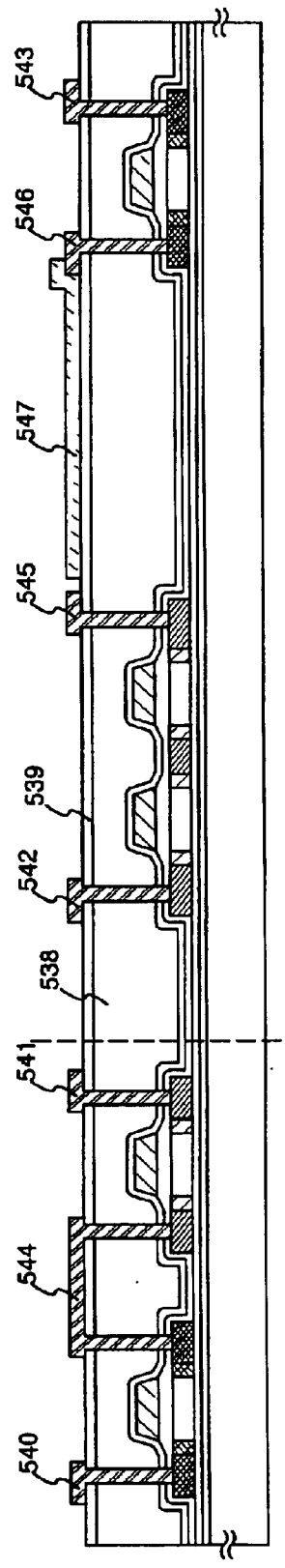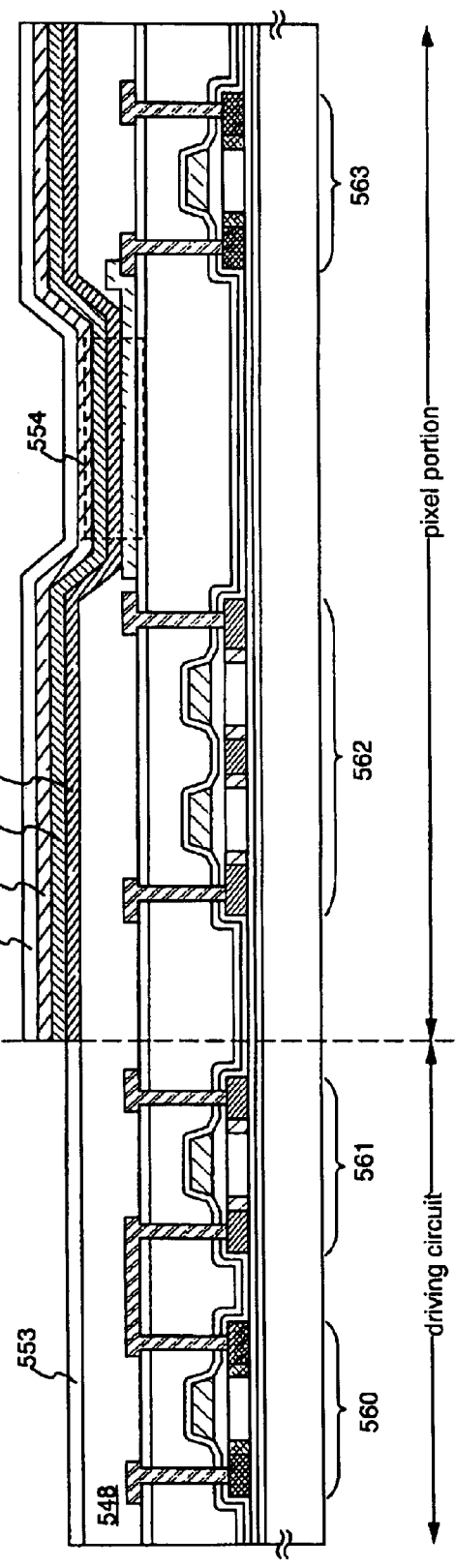
FIG. 7A
FIG. 7B

FIG. 10 transmissivity of AlNxOy

FIG. 11  transmissivity of AlxNy

LIGHT EMITTING DEVICE, ELECTRONIC EQUIPMENT, AND METHOD OF MANUFACTURING THEREOF

BACKGROUND OF THE INVENTION

1. Field of the Invention

The present invention relates to an OLED (organic light-emitting device) panel obtained by forming an OLED on a substrate and sealing the OLED between the substrate and a cover member. The invention also relates to an OLED module in which an IC including a controller, or the like, is mounted to the OLED panel. In this specification, 'light-emitting device' is the generic term for the OLED panel and for the OLED module. Electronic equipment using the light-emitting device is also included in the present invention.

2. Description of the Related Art

Being self-luminous, OLEDs eliminate the need for a backlight that is necessary in liquid crystal display devices (LCDs) and thus make it easy to manufacture thinner devices. Also, the self-luminous OLEDs are high in visibility and have no limit in terms of viewing angle. These are the reasons for attention that light-emitting devices using the OLEDs are receiving in recent years as display devices to replace CRTs and LCDs.

An OLED has a layer containing an organic compound (organic light-emitting material) that provides luminescence (electroluminescence) when an electric field is applied (the layer is hereinafter referred to as organic light-emitting layer), in addition to an anode layer and a cathode layer. Luminescence obtained from organic compounds is classified into light emission upon return to the base state from singlet excitation (fluorescence) and light emission upon return to the base state from triplet excitation (phosphorescence). A light-emitting device according to the present invention can use one or both types of the light emission.

In this specification, all the layers that are provided between an anode and a cathode together make an organic light emitting layer. Specifically, the organic light emitting layer includes a light emitting layer, a hole injection layer, an electron injection layer, a hole transporting layer, an electron transporting layer, etc. A basic structure of an OLED is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

The problem in putting a light-emitting device using the OLED into practice is degradation of the device by heat, light, moisture, oxygen, and other causes.

When manufacturing a light-emitting device with OLED, in general, the OLED is formed after a wiring line and a semiconductor element are formed in a pixel portion. Once the OLED is formed, a first substrate on which the OLED is placed is bonded to a second substrate (made of metal or glass) for sealing (packaging) the OLED so that the OLED is not exposed to the outside air. A resin or the like is used to bond the substrates and nitrogen or inert gas fills the space between the substrates. However, oxygen easily reaches the OLED sealed as above by the substrates and a resin through the slightest crack in the package. Furthermore, moisture finds no difficulty in seeping into the OLED through the resin used in bonding and sealing. This causes non-light emission portions called dark spots, which grow larger with time and emit no light, which becomes a problem.

SUMMARY OF THE INVENTION

The present invention has been made to solve the above problem and an object of the present invention is therefore to provide a light-emitting device using a highly reliable OLED. Another object of the present invention is to provide electronic equipment with a highly reliable display unit by employing such light-emitting device with the OLED for its display unit.

The present invention relates to a technique for sealing an OLED that is placed on a substrate having an insulating surface. To seal the OLED, the present invention employs vacuum sealing using a film that is provided, on one side (inside) at least, with a thin film low in gas transmissivity (typically, a thin film mainly containing carbon, a silicon oxynitride film, a silicon nitride film, a film of a compound expressed as $AlN_xO_y$, a AlN film, or a laminate of these films).

In the present invention, a film low in gas transmissivity is used to provide a film while adding a rare gas element to reaction gas in order to give the film flexibility. The present invention is characterized in that a thin film low in gas transmissivity (typically, a thin film mainly containing carbon, a silicon oxynitride film, a silicon nitride film, a film of a compound expressed as $AlN_xO_y$, a AlN film, or a laminate of these films) contains a rare gas element to ease the internal stress in the film and to make the film flexible, and that a film provided, at least on one side (inside), with the thin film is used to vacuum-seal a light-emitting device having an OLED.

A film obtains flexibility by containing rare gas. Therefore, the thin film used to provide the wrapping film is prevented from developing a crack or peeling off when thermally press-fit in vacuum. Moreover, the film used as a lining can improve the heat resistance and mechanical strength of the wrapping film.

A structure of the present invention disclosed in this specification is a light-emitting device characterized in that:

the device includes a TFT, an active matrix substrate on which a light emitting element having the TFT is formed, a desiccant, and a protective unit wrapping the active matrix substrate; and the protective unit is a film at least partially provided with a thin film that contains a rare gas element and mainly contains carbon. In this specification, a substrate on which an OLED is formed is called an active matrix substrate.

In the above structure, the light emitting element has an anode, a cathode, and an EL material sandwiched between the anode and the cathode.

In the above structure, the protective unit is brought into contact with the active matrix substrate by vacuum press-fitting. Accordingly, the protective unit has flexibility to a certain degree. Any film can be used for this protective unit as long as it is an excellent gas barrier and is transparent or translucent with respect to visible light. For example, the protective unit may be a film entirely covered with a thin film that contains carbon as its main component, or a film provided with a thin film that contains carbon as its main component on one side (inside or outside).

The present invention is characterized in that the thin film that contains carbon as its main component is a DLC (diamond like carbon) film with a thickness of 3 to 50 nm. A DLC film has a $SP^3$ bond as the bond between carbon atoms in terms of short range order. Macroscopically, a DLC film has an amorphous structure. A DLC film is composed of 70 to 95 atomic % of carbon and 5 to 30 atomic % of hydrogen, which makes the DLC film very hard and excellent in insulating. A DLC film as such is also characterized by having a low transmissivity for steam, oxygen, and other gas. A DLC film is known to have a hardness of 15 to 25 GPa when measured by a microhardness tester.

A DLC film is formed by plasma CVD, microwave CVD, electron cyclotron resonance (ECR) CVD, sputtering, etc. Any of these methods can provide a DLC film having an appropriate adhesion. A DLC film is formed by setting a substrate as the cathode. When a negative bias is applied and some of ion impact is utilized, a dense and hard DLC film can be obtained.

Reaction gas used in forming a DLC film by plasma CVD is hydrocarbon-based gas, for example, $CH_4$, $C_2H_2$, or $C_6H_6$. The reaction gas is ionized by glow discharge and the ions are accelerated to impact against a cathode to which a negative self-bias is applied. As a result, a dense and flat DLC film can be obtained.

This DLC film is characterized by being an insulating film which is transparent or translucent to visible light.

In this specification, being transparent to visible light means to have a transmissivity of 80 to 100% for visible light whereas being translucent to visible light means to have a transmissivity of 50 to 80% for visible light.

A silicon oxynitride film may be used instead of the above DLC film. In this case, the protective unit is a film at least partially provided with a silicon oxynitride film.

A silicon nitride film may be used instead of the above DLC film. In this case, the protective unit is a film at least partially provided with a silicon nitride film.

An AlN film may be used instead of the above DLC film. In this case, the protective unit is a film at least partially provided with an AlN film.

An $AlN_XO_Y$ film may be used instead of the above DLC film. In this case, the protective unit is a film at least partially provided with an $AlN_XO_Y$ film.

A laminate having in combination a DLC film, a silicon oxynitride film, a silicon nitride film, an AlN film, and a film of an $AlN_XO_Y$ film may also be used. In this case, the protective unit is a film at least partially provided with the laminate.

Preferably, the silicon nitride film, the AlN film, or the $AlN_XO_Y$ film is formed by sputtering and rare gas is introduced to the chamber so that the formed film contains a rare gas element (typically Ar) in a concentration of 0.1 atomic % or higher, more desirably, 1 to 30 atomic % or higher.

In the above structure, a desiccant is preferably placed between the active matrix substrate and the protective unit sealed in vacuum in order to prevent degradation of the light emitting element. A suitable desiccant is barium oxide, a calcium oxide, silica gel, or the like. The desiccant is placed before or after a flexible printed substrate is bonded. Alternatively, the desiccant may be set in a flexible film of the flexible printed substrate and then the flexible printed substrate is bonded. Preferably, the desiccant is placed near the location where the protective unit is press-fit in vacuum.

A structure of the present invention for obtaining the above structure is a method of manufacturing a light-emitting device, characterized by comprising the steps of:

forming a light emitting element on a substrate that has an insulating surface;

bonding a flexible printed substrate to the edge of the substrate; and sealing in vacuum the light emitting element and a part of the flexible printed substrate using a film that is covered with a thin film mainly containing carbon.

In the above structure, the step of forming the light emitting element may be followed by a step of thinning the thickness of the substrate. If the substrate is thinned, the thinning step is preferably followed by the step of bonding the flexible printed substrate to the edge of the former substrate.

In the above structures, the method is characterized by comprising a step of placing a desiccant that is in contact with the flexible printed substrate before the vacuum sealing step. The vacuum sealing step employs thermal press-fitting.

In the above structures, the thin film mainly containing carbon is a DLC film containing a rare gas element in a concentration of 0.1 atomic % or higher, preferably 1 to 30 atomic %.

In the above structures, the rare gas element is one or more kinds of elements selected from the group consisting of He, Ne, Ar, Kr, and Xe.

BRIEF DESCRIPTION OF THE DRAWINGS

In the accompanying drawings:

FIGS. 5A to 5D are diagrams showing a process of manufacturing an active matrix substrate;

FIGS. 7A and 7B are diagrams showing a process of manufacturing an active matrix substrate;

DETAILED DESCRIPTION OF THE PREFERRED EMBODIMENTS

Embodiment Modes 1 and 2 will be described below with reference to FIGS. 1A to 3.

[Embodiment Mode 1]

First, a substrate having an insulating surface is prepared. On the substrate, a light emitting element, here, OLED, and a lead-out electrode 102 are provided. The lead-out electrode 102 connects the OLED to an external power supply. If light from the light emitting element is transmitted through the substrate, used as the substrate having an insulating surface is a light transmissive substrate such as a glass substrate, a crystallized glass substrate, or a plastic substrate. If light from the light emitting element does not travel through the substrate, a ceramic substrate, a semiconductor substrate, a metal substrate, and the like may be used.

Figure 1A:
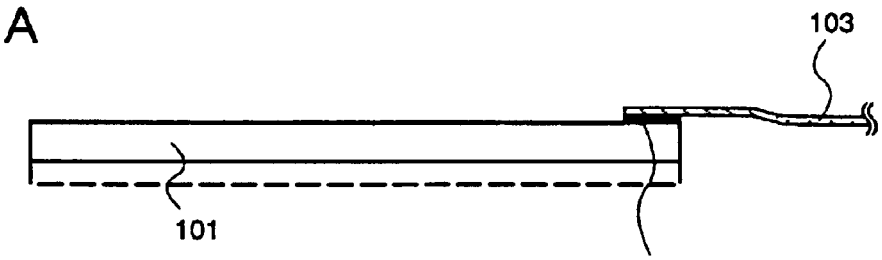
FIGS. 1A to 1C are diagrams showing a process of manufacturing a light-emitting device.

In order to reduce the weight of the device, etch off treatment is performed on the substrate and the substrate is thinned. A substrate 101 having the OLED formed thereon is thus obtained. The etch off treatment may not always be necessary. Next, a flexible printed substrate (FPC) 103 is bonded to the substrate 101 to be electrically connected to the lead-out electrode 102. (FIG. 1A)

A desiccant 104 is placed on the substrate 101 having the OLED formed thereon in order to prevent degradation of the OLED due to oxygen, moisture, and the like. The desiccant 104 is a hygroscopic substance (preferably calcium oxide or barium oxide), or a substance capable of adsorbing oxygen. Here, the desiccant 104 is placed so as to come into contact with the FPC 103 and an end face of the substrate 101. This prevents a protective unit from being locally stretched and damaged in a later step of vacuum press-fitting.

Figure 1B:
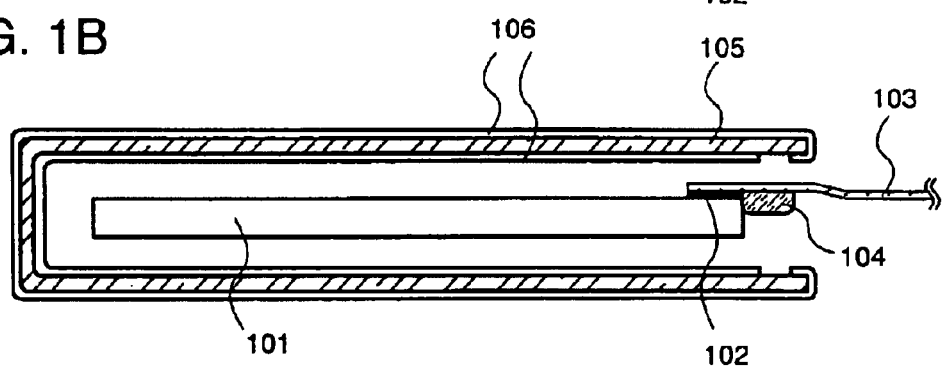

The protective unit that can serve as a gas barrier is thermally press-fit in vacuum to seal the OLED and further prevent degradation of the OLED due to oxygen, moisture, and the like. The protective unit can be any film which is transparent or translucent to visible light and which can be press-fit in vacuum. FIG. 1B shows the protective unit before vacuum press-fitting.

The protective unit used here is a wrapping film 105 that is covered with a DLC film 106 containing rare gas (Ar). The wrapping film 105 that is covered with a DLC film 106 containing Ar wraps the substrate 101 with the OLED formed thereon, the desiccant 104, and a part of the flexible printed substrate 103 for vacuum packing. Shown here is an example of a wrapping film covered with a DLC film except the portion for press-fitting. However, the wrapping film may be merely provided with a DLC film on one side (inside or outside). The film used to provide or cover the wrapping film is not limited to a single-layer film but may be a multi-layered film.

Figure 1C:
Figure 3:
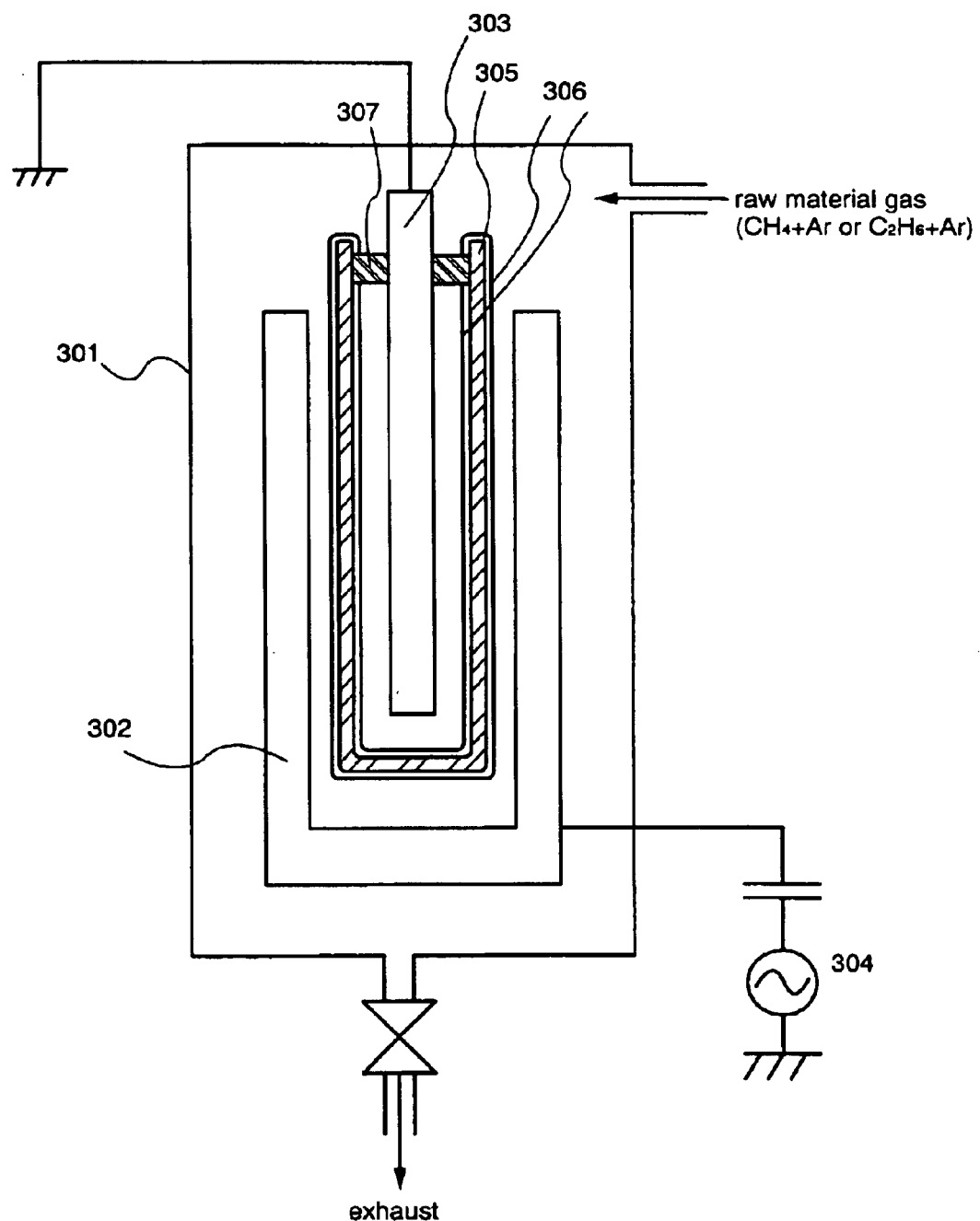
FIG. 3 is a diagram showing an apparatus for forming a DLC film (plasma CVD apparatus)

The DLC film 106 containing rare gas (Ar) is formed in a film forming apparatus that uses plasma CVD and is shown in FIG. 3. A chamber 301 is exhausted to reach vacuum and a mixture of $CH_4$ gas and Ar gas, or a mixture of $C_2H_6$ gas and Ar gas, is introduced as raw material gas into the chamber. Then a DLC film (containing Ar) 306 is formed on the surface of a wrapping film 305. The wrapping film is fixed by a holder 307 between an electrode 302 that is connected to an RF power supply 304 and an electrode 303. Note that the DLC film 306 is not formed on portions of the wrapping film 305 that are in contact with the holder 307. The present invention uses these portions where the DLC film is not formed for thermal press-fitting. FIG. 1C shows the protective unit after vacuum press-fitting. The wrapping film used here is like a sack or an empty box. Alternatively, the wrapping film may be composed of two sheets laid on top of each other and the four sides thereof are all press-fit. A preferable material of the wrapping film is one that can be bonded also to a flexible tape in thermal press-fitting. The material usable as the wrapping film is a resin material (polyethylene terephthalate (PET), polyether sulfon (PES), polyethylene naphthalate (PEN), polycarbonate (PC), nylon, polyether ether ketone (PEEK), polysulfon (PSF), polyether imide (PEI), polyarylate (PAR), polybuthylene terephthalate (PBT), etc.). Typically, thermoplastic, a PVF (polyvinyl fluoride) film, a Mylar film, or an acrylic resin film is used. After thermal press-fitting, the press-fit portions may be further sealed using an adhesive, and the FPC may be bonded to the protective unit with an adhesive.

Once the OLED is formed on the substrate, the above steps are conducted desirably avoiding exposure of the OLED to the outside air as much as possible.

In this way, the present invention can provide a light-emitting device using an OLED whose reliability is increased by controlling degradation due to moisture, oxygen, and the like.

[Embodiment Mode 2]

Figure 2:
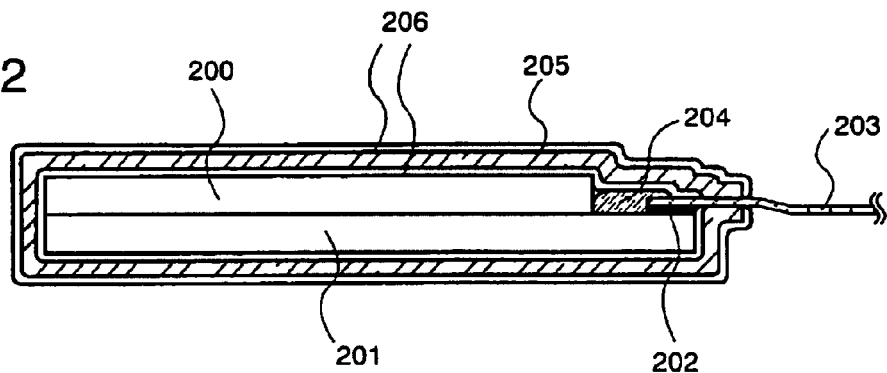
FIG. 2 is a diagram showing a process of manufacturing a light-emitting device.

A description given here with reference to FIG. 2 is about an example of a light-emitting device in which an OLED is sealed using a sealing substrate 200 and then further sealed by a protective unit.

In FIG. 2, 200 denotes a sealing substrate, 201, a substrate having an OLED formed thereon, 202, a lead-out electrode, 203, an FPC, 204, a desiccant, 205, a wrapping film, and 206, a DLC film containing Ar. Although the film 206 here is a DLC film containing Ar, the DLC film may be replaced by a silicon oxynitride film containing Ar, a silicon nitride film containing Ar, a Ar-containing film of a compound expressed as $AlN_xO_y$, or a AlN film containing Ar.

By containing Ar, the film can be flexible and therefore can be prevented from developing a crack or peeling off when used to provide the wrapping film and thermally press-fit in vacuum.

Though not shown in the drawing, the sealing substrate 200 is bonded to the substrate 201 with an adhesive. The space between the sealing substrate 200 and the substrate 201 is filled with a resin, nitrogen, or inert gas. If light from the light emitting element is transmitted through the sealing substrate 200, used as the sealing substrate is a light transmissive substrate such as a glass substrate, a crystallized glass substrate, or a plastic substrate. If light from the light emitting element does not travel through the sealing substrate 200, a ceramic substrate, a semiconductor substrate, a metal substrate, and the like may be used. The sealing substrate 200 may not always take the shape of a plate but may resemble a lid.

The desiccant 204 here is placed on the substrate 201 between the FPC 203 and the sealing substrate 201, so that the protective unit is prevented from being locally stretched and damaged in a later step of vacuum press-fitting.

The present invention structured as above will be further detailed through the following Embodiments.

[Embodiment 1]

Figure 4A:
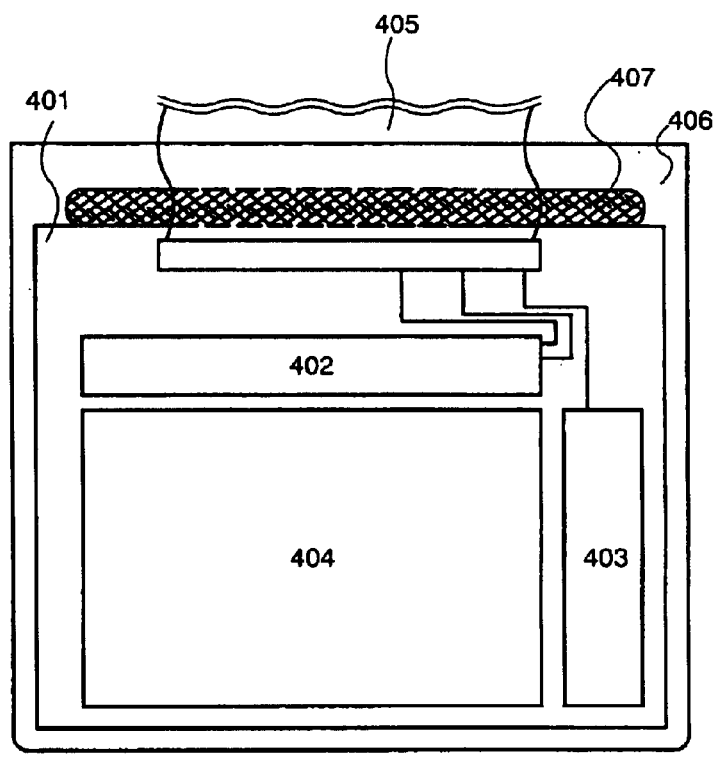
FIGS. 4A and 4B are a top view and a sectional view of an OLED module, respectively.
Figure 4B:
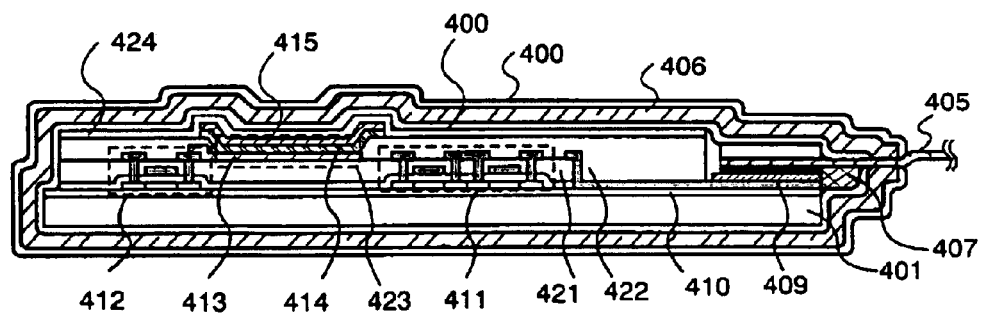

FIG. 4A is a top view of an OLED module manufactured. FIG. 4B is a sectional view schematically showing one pixel of the module of FIG. 4A.

A pixel portion 404 is arranged on a substrate 401 such that a source line driving circuit 402 and a gate line driving circuit 403 respectively run parallel to two sides of the pixel portion. The pixel portion 404, the source line driving circuit 402, and the gate line driving circuit 403 each have a plurality of TFTs. FIG. 4B shows, as representatives of those TFTs, a driving circuit TFT (composed of an n-channel TFT and a p-channel TFT in FIG. 4B) 411 included in the source line driving circuit 402 and a driving TFT (a TFT for controlling a current flowing into the OLED) 412 included in the pixel portion 404. The TFTs 411 and 412 are formed on a base film 410.

In this embodiment, the n-channel TFT and the p-channel TFT that constitute the driving circuit TFT 411 are manufactured by a known method, and a p-channel TFT manufactured by a known method is used for the driving TFT 412. The pixel portion 404 is provided with a capacitor storage (not shown) connected to a gate electrode of the driving TFT 412.

Formed on the driving circuit TFT 411 and the driving TFT 412 is an interlayer insulating film (planarization film) 421, on which a pixel electrode (anode) 413 is formed to be electrically connected to a drain of the driving TFT 412. The pixel electrode 413 is formed of a transparent conductive film having a large work function. Examples of the usable transparent conductive film material include a compound of indium oxide and tin oxide, a compound of indium oxide and zinc oxide, zinc oxide alone, tin oxide alone, and indium oxide alone. A transparent conductive film formed of one of these materials and doped with gallium may also be used for the pixel electrode.

An insulating film 422 is formed on the pixel electrode 413. An opening is formed in the insulating film 422 above the pixel electrode 413. At the opening above the pixel electrode 413, an organic light emitting layer 414 is formed. The organic light emitting layer 414 is formed of a known organic light emitting material or inorganic light emitting material. Either low molecular weight (monomer) organic light emitting materials or high molecular weight (polymer) organic light emitting materials can be used for the organic light emitting layer.

The organic light emitting layer 414 is formed by a known evaporation technique or application technique. The organic light emitting layer may consist solely of a light emitting layer. Alternatively, the organic light emitting layer may be a laminate having, in addition to a light emitting layer, a hole injection layer, a hole transporting layer, an electron transporting layer, and an electron injection layer in any combination.

A cathode 415 is formed on the organic light emitting layer 414 from a light-shielding conductive film (typically, a conductive film mainly containing aluminum, copper, or silver, or a laminate consisting of the above conductive film and other conductive films). Desirably, moisture and oxygen are removed as much as possible from the interface between the cathode 415 and the organic light emitting layer 414. Some contrivance is therefore needed for the removal. For example, the organic light emitting layer 414 is formed in a nitrogen or rare gas atmosphere and then the cathode 415 is successively formed without keeping the substrate from moisture and oxygen. This embodiment uses a multi-chamber system (cluster tool system) film forming apparatus to achieve the film formation described above. The cathode 415 receives a given voltage.

An OLED 423 composed of the pixel electrode (anode) 413, the organic light emitting layer 414, and the cathode 415 is thus formed. A protective film 424 is formed on the insulating film 422 so as to cover the OLED 423. The protective film 424 is effective in preventing oxygen and moisture from entering the OLED 423.

Denoted by reference numeral 409 is a lead-out wiring line connected to a power supply line, and is electrically connected to a source region of the driving TFT 412. The lead-out wiring line 409 is electrically connected to an FPC wiring line of an FPC 405 through an anisotropic conductive film. The anisotropic conductive film has a conductive filler. At the same time the pixel electrode 413 is formed, a conductive film is formed so as to come into contact with the top face of the lead-out wiring line. The conductive filler electrically connects the conductive film on the substrate 401 to the FPC wiring line on the FPC 405 upon thermal press-fitting of the substrate 401 and the FPC 405.

Denoted by reference numeral 406 is a wrapping film for wrapping the substrate on which the OLED is formed. The wrapping film 406 is, by vacuum press-fitting, brought into contact with the substrate 401 and the OLED 423 formed on the substrate so as to prevent moisture, oxygen, and the like from entering the OLED 423. The wrapping film 406 is covered with a DLC film 400 containing Ar.

By containing rare gas, a film can be flexible and therefore the DLC film 400 can be prevented from developing a crack or peeling off when used to provide the wrapping film 406 and thermally press-fit in vacuum.

Denoted by reference numeral 407 is a desiccant, which is a hygroscopic substance (preferably calcium oxide or barium oxide), or a substance capable of adsorbing oxygen. Here, the desiccant 407 is placed so as to come into contact with the FPC 405 and an end face of the substrate 401. This prevents a protective unit from being locally stretched and damaged in the vacuum press-fitting step.

The thus manufactured OLED module that is an organic light emitting display device can be used as a display unit in various electronic equipment.

[Embodiment 2]

Next, described with reference to FIGS. 5 to 7 is an example of a method of manufacturing a substrate (active matrix substrate) using the light-emitting device of the present invention. Here, the method of simultaneously forming, on the same substrate, the switching TFT and the driving TFT of the pixel portion, and the TFTs of a driving portion provided surrounding the pixel portion is described in detail according to steps.

This embodiment uses a substrate 500 of a glass such as barium borosilicate glass or aluminoborosilicate glass as represented by the glass #7059 or the glass #1737 of Corning Co. There is no limitation on the substrate 500 provided it has a property of transmitting light, and there may be used a quartz substrate. There may be further used a plastic substrate having heat resistance capable of withstanding the treatment temperature of this embodiment.

Referring next to FIG. 5A, a base film 501 comprising an insulating film such as silicon oxide film, silicon nitride film or silicon oxynitride film is formed on the substrate 500. In this embodiment, the base film 501 has a two-layer structure. There, however, may be employed a structure in which a single layer or two or more layers are laminated on the insulating film. The first layer of the base film 501 is a silicon oxynitride film 501a formed maintaining a thickness of from 10 to 200 nm (preferably, from 50 to 100 nm) relying upon a plasma CVD method by using $SiH_4$, $NH_3$ and $N_2O$ as reaction gases. In this embodiment, the silicon oxynitride film 501a (having a composition ratio of Si=32%, O=27%, N=24%, H=17%) is formed maintaining a thickness of 50 nm. The second layer of the base film 501 is a silicon oxynitride film 501b formed maintaining a thickness of from 50 to 200 nm (preferably, from 100 to 150 nm) relying upon the plasma CVD method by using $SiH_4$ and $N_2O$ as reaction gases. In this embodiment, the silicon oxynitride film 501b (having a composition ratio of Si=32%, O=59%, N=7%, H =2%) is formed maintaining a thickness of 100 nm.

Then, semiconductor layers 502 to 505 are formed on the base film 501. The semiconductor layers 502 to 505 are formed by forming a semiconductor film having an amorphous structure by a known means (sputtering method, LPCVD method or plasma CVD method) followed by a known crystallization processing (laser crystallization method, heat crystallization method or heat crystallization method using a catalyst such as nickel), and patterning the crystalline semiconductor film thus obtained into a desired shape. The semiconductor layers 502 to 505 are formed in a thickness of from 25 to 80 nm (preferably, from 30 to 60 nm). Though there is no limitation on the material of the crystalline semiconductor film, there is preferably used silicon or a silicon-germanium ($Si_xGe_{1-x}$(X=0.0001 to 0.02)) alloy. In this embodiment, the amorphous silicon film is formed maintaining a thickness of 55 nm relying on the plasma CVD method and, then, a solution containing nickel is held on the amorphous silicon film. The amorphous silicon film is dehydrogenated (500° C., one hour), heat-crystallized (550° C., 4 hours) and is, further, subjected to the laser annealing to improve the crystallization, thereby to form a crystalline silicon film. The crystalline silicon film is patterned by the photolithographic method to form semiconductor layers 502 to 505.

The semiconductor layers 502 to 505 that have been formed may further be doped with trace amounts of an impurity element (boron or phosphorus) to control the threshold value of the TFT.

In forming the crystalline semiconductor film by the laser crystallization method, further, there may be employed an excimer laser of the pulse oscillation type or of the continuously light-emitting type, a YAG laser or a YVO$_4$ laser. When these lasers are to be used, it is desired that a laser beam emitted from a laser oscillator is focused into a line through an optical system so as to fall on the semiconductor film.

Then, a gate insulating film 506 is formed to cover the semiconductor layers 502 to 505. The gate insulating film 506 is formed of an insulating film containing silicon maintaining a thickness of from 40 to 150 nm by the plasma CVD method or the sputtering method. In this embodiment, the gate insulating film is formed of a silicon oxynitride film (composition ratio of Si=32%, O=59%, N=7%, H=2%) maintaining a thickness of 110 nm by the plasma CVD method. The gate insulating film is not limited to the silicon oxynitride film but may have a structure on which is laminated a single layer or plural layers of an insulating film containing silicon.

When the silicon oxide film is to be formed, TEOS (tetraethyl orthosilicate) and O$_2$ are mixed together by the plasma CVD method, and are reacted together under a reaction pressure of 40 Pa, at a substrate temperature of from 300 to 400° C., at a frequency of 13.56 MHz and a discharge electric power density of from 0.5 to 0.8 W/cm$^2$. The thus formed silicon oxide film is, then, heat annealed at 400 to 500° C. thereby to obtain the gate insulating film having good properties.

Then, a heat resistant conductive layer 507 is formed on the gate insulating film 506 maintaining a thickness of from 200 to 400 nm (preferably, from 250 to 350 nm) to form the gate electrode. The heat-resistant conductive layer 507 may be formed as a single layer or may, as required, be formed in a structure of laminated layers of plural layers such as two layers or three layers. The heat resistant conductive layer contains an element selected from Ta, Ti and W, or contains an alloy of the above element, or an alloy of a combination of the above elements. The heat-resistant conductive layer is formed by the sputtering method or the CVD method, and should contain impurities at a decreased concentration to decrease the resistance and should, particularly, contain oxygen at a concentration of not higher than 30 ppm. In this embodiment, the W film is formed maintaining a thickness of 300 nm. The W film may be formed by the sputtering method by using W as a target, or may be formed by the hot CVD method by using tungsten hexafluoride (WF$_6$).

Next, a mask 508 is formed by a resist relying upon the photolithographic technology. Then, a first etching is executed. As the etching gas, chlorine type gas such as Cl$_2$, BCl$_3$, SiCl$_4$, and CCl$_4$ or fluorine gas such as CF$_4$, SF$_6$, and NF$_3$, or O$_2$ can be appropriately used. This embodiment uses an ICP etching device, uses Cl$_2$ and CF$_4$ as etching gases, and forms a plasma with RF (13.56 MHz) electric power of 3.2 W/cm$^2$ under a pressure of 1 Pa. The RF (13.56 MHz) electric power of 224 mW/cm$^2$ is supplied to the side of the substrate (sample stage), too, whereby a substantially negative self bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The conductive layers 509 to 512 having a first tapered shape are formed by the first etching treatment. The conductive layers 509 to 512 are tapered at an angle of from 15 to 30°. To execute the etching without leaving residue, over-etching is conducted by increasing the etching time by about 10 to 20%. The selection ratio of the silicon oxynitride film (gate insulating film 506) to the W film is 2 to 4 (typically, 3). Due to the over etching, therefore, the surface where the silicon oxynitride film is exposed is etched by about 20 to about 50 nm (FIG. 5B).

Then, a first doping treatment is effected to add an impurity element of a first type of electric conduction to the semiconductor layer. Here, a step is conducted to add an impurity element for imparting the n-type. A mask 508 forming the conductive layer of a first shape is left, and an impurity element is added by the ion-doping method to impart the n-type in a self-aligned manner with the conductive layers 509 to 512 having a first tapered shape as masks. The dosage is set to be from $1 \times 10^{13}$ to $5 \times 10^{14}$ atoms/cm$^2$ so that the impurity element for imparting the n-type reaches the underlying semiconductor layer penetrating through the tapered portion and the gate insulating film 506 at the ends of the gate electrode, and the acceleration voltage is selected to be from 80 to 160 keV. As the impurity element for imparting the n-type, there is used an element belonging to the Group 15 and, typically, phosphorus (P) or arsenic (As). Phosphorus (P) is used, here. Due to the ion-doping method, an impurity element for imparting the n-type is added to the first impurity regions 514 to 517 over a concentration range of from $1 \times 10^{20}$ to $1 \times 10^{21}$ atoms/cm$^3$ (FIG. 5C).

In this step, the impurities turn down to the lower side of the conductive layers 509 to 512 of the first shape depending upon the doping conditions, and it often happens that the first impurity regions 514 to 517 are overlapped on the conductive layers 509 to 512 of the first shape.

Next, the second etching treatment is conducted as shown in FIG. 5D. The etching treatment, too, is conducted by using the ICP etching device, using a mixed gas of CF$_4$ and Cl$_2$ as an etching gas, using an RF electric power of 3.2 W/cm$^2$ (13.56 MHz), a bias power of 45 mW/cm$^2$ (13.56 MHz) under a pressure of 1.0 Pa. Under this condition, there are formed the conductive layers 518 to 521 of a second shape. The end portions thereof are tapered, and the thickness gradually increases from the ends toward the inside. The rate of isotropic etching increases in proportion to a decrease in the bias voltage applied to the side of the substrate as compared to the first etching treatment, and the angle of the tapered portions becomes 30 to 60°. The mask 508 is ground at the edge by etching to form a mask 522. In the step of FIG. 5D, the surface of the gate insulating film 506 is etched by about 40 nm.

Figure 6A:
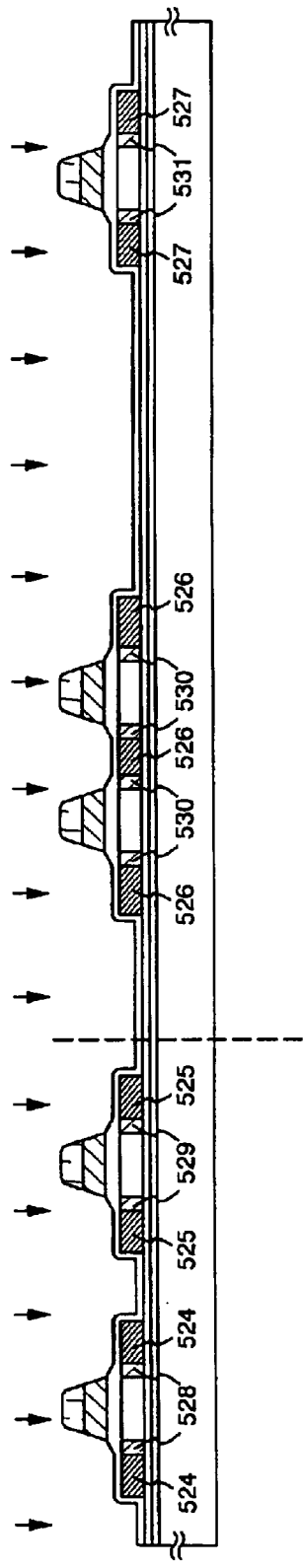
FIGS. 6A to 6C are diagrams showing a process of manufacturing an active matrix substrate.

Then, the doping is effected with an impurity element for imparting the n-type under the condition of an increased acceleration voltage by decreasing the dosage to be smaller than that of the first doping treatment. For example, the acceleration voltage is set to be from 70 to 120 keV, the dosage is set to be $1 \times 10^{13}$/cm$^2$ thereby to form first impurity regions 524 to 527 having an increased impurity concentration, and second impurity regions 528 to 531 that are in contact with the first impurity regions 524 to 527. In this step, the impurity may turn down to the lower side of the conductive layers 518 to 521 of the second shape, and the second impurity regions 528 to 531 may be overlapped on the conductive layers 518 to 521 of the second shape. The impurity concentration in the second impurity regions is from $1 \times 10^{16}$ to $1 \times 10^{18}$ atoms/cm$^3$ (FIG. 6A).

Figure 6B:
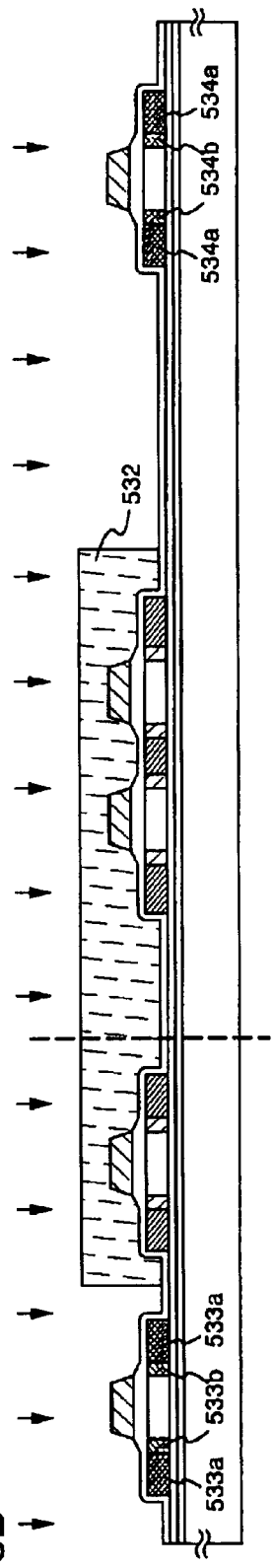

Referring to FIG. 6B, impurity regions 533 (533a, 533b) and 534 (534a, 534b) of the conduction type opposite to the one conduction type are formed in the semiconductor layers 502, 505 that form the p-channel TFTs. In this case, too, an impurity element for imparting the p-type is added using the conductive layers 518, 521 of the second shape as masks to form impurity regions in a self-aligned manner. At this moment, the semiconductor layers 503 and 504 forming the n-channel TFTs are entirely covered for their surfaces by forming a mask 532 of a resist. Here, the impurity regions 533 and 534 are formed by the ion-doping method by using diborane ($B_2H_6$). The impurity element for imparting the p-type is added to the impurity regions 533 and 534 at a concentration of from $2 \times 10^{20}$ to $2 \times 10^{21}$ atoms/cm$^3$.

If closely considered, however, the impurity regions 533, 534 can be divided into two regions containing an impurity element that imparts the n-type. Third impurity regions 533a and 534a contain the impurity element that imparts the n-type at a concentration of from $1 \times 10^{20}$ to $1 \times 10^{21}$ atoms/cm$^3$ and fourth impurity regions 533b and 534b contain the impurity element that imparts the n-type at a concentration of from $1 \times 10^{17}$ to $1 \times 10^{20}$ atoms/cm$^3$. In the impurity regions 533b and 534b, however, the impurity element for imparting the p-type is contained at a concentration of not smaller than $1 \times 10^{19}$ atoms/cm$^3$ and in the third impurity regions 533a and 534a, the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem.

Figure 6C:
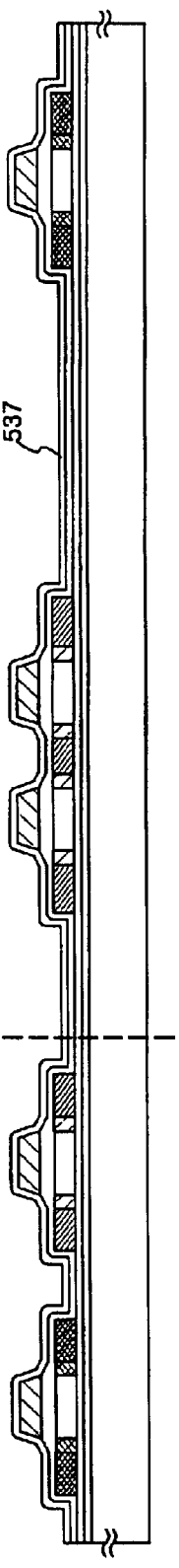

Referring next to FIG. 6C, a first interlayer insulating film 537 is formed on the conductive layers 518 to 521 of the second shape and on the gate insulating film 506. The first interlayer insulating film 537 may be formed of a silicon oxide film, a silicon oxynitride film, a silicon nitride film, or a laminated layer film of a combination thereof. In any case, the first interlayer insulating film 537 is formed of an inorganic insulating material. The first interlayer insulating film 537 has a thickness of 100 to 200 nm. When the silicon oxide film is used as the first interlayer insulating film 537, TEOS and $O_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm$^2$. When the silicon oxynitride film is used as the first interlayer insulating film 537, this silicon oxynitride film may be formed from $SiH_4$, $N_2O$ and $NH_3$, or from $SiH_4$ and $N_2O$ by the plasma CVD method. The conditions of formation in this case are a reaction pressure of from 20 to 200 Pa, a substrate temperature of from 300 to 400° C. and a high-frequency (60 MHz) power density of from 0.1 to 1.0 W/cm$^2$. As the first interlayer insulating film 537, further, there may be used a hydrogenated silicon oxynitride film formed by using $SiH_4$, $N_2O$ and $H_2$. The silicon nitride film, too, can similarly be formed by using $SiH_4$ and $NH_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this embodiment, the heat treatment is conducted at 550° C. for 4 hours. When a plastic substrate having a low heat resistance temperature is used as the substrate 501, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}$/cm$^3$ in the semiconductor layer with hydrogen that is thermally excited. As another means of hydrogenation, the plasma hydrogenation may be executed (using hydrogen excited with plasma). In any way, it is desired that the defect density in the semiconductor layers 502 to 505 is suppressed to be not larger than $1 \times 10^{16}$/cm$^3$. For this purpose, hydrogen may be added in an amount of from 0.01 to 0.1 atomic %.

Then, a second interlayer insulating film 538 of an organic insulating material is formed maintaining an average thickness of from 1.0 to 2.0 μm. As the organic resin material, there can be used polyimide, acrylic resin, polyamide, polyimideamide and BCB (benzocyclobutene). When there is used, for example, a polyimide of the type that is heat polymerized after being applied onto the substrate, the second interlayer insulating film is formed being fired in a clean oven at 300° C. When there is used an acrylic resin, there is used the one of the two-can type. Namely, the main material and a curing agent are mixed together, applied onto the whole surface of the substrate by using a spinner, pre-heated by using a hot plate at 80° C. for 60 seconds, and are fired at 250° C. for 60 minutes in a clean oven to form the second interlayer insulating film.

Next, the passivation film 539 is formed. In this embodiment, the silicon nitride film is used as a passivation film 539. In the case where the second interlayer insulating film 538 includes an organic resin material, it is particularly effective to provide the passivation film 539 since the organic resin material contains a large amount of moisture.

Here, the conductive metal film is formed by sputtering and vacuum vaporization and is patterned by using a mask and is, then, etched to form source wirings 540 to 543, drain wirings 544 to 546. Further, though not diagramed in this embodiment, the wiring is formed by a laminate of a 50 nm thick Ti film and a 500 nm thick alloy film (alloy film of Al and Ti).

Then, a transparent conductive film is formed thereon maintaining a thickness of 80 to 120 nm, and is patterned to form a pixel electrode 547 (FIG. 7A). Therefore, the pixel electrode 547 is formed by using an indium tin-oxide (ITO) film as a transparent electrode or a transparent conductive film obtained by mixing 2 to 20% of a zinc oxide (ZnO) into indium oxide. The pixel electrode 547 functions as an anode of a light emitting element. Further, the pixel electrode 547 is formed being in contact with, and overlapped on, the drain wiring 546 that is electrically connected to the drain region of the driving TFT.

Next, as shown in FIG. 7B, the third interlayer insulating film 548 having an opening portion at the position corresponding to the pixel electrode 547 is formed. In this embodiment, side walls having a tapered shape are formed by using a wet etching method in forming the opening portion. Differently from the case shown in this embodiment, the organic light emitting layer formed on the third interlayer insulating film 548 is not separated. Thus, the deterioration of the organic light emitting layer which derives from a step becomes a conspicuous problem if the side walls of the opening portion are not sufficiently gentle, which requires attention.

Although a film from silicon oxide film is used in this embodiment for the third interlayer insulating film 548, organic resin films such as polyimide, polyamide, acrylic, BCB (benzocycrobutene), or silicon oxide film may also be used in some cases.

Then, it is preferable that, before the organic light emitting layer 550 is formed on the third interlayer insulating film 548, plasma processing using argon is conducted to the surface of the third interlayer insulating film 548 to make close the surface of the third interlayer insulating film 548. With the above structure, it is possible to prevent moisture from permeating the organic light emitting layer 550 from the third interlayer insulating film 548.

An organic light emitting layer 550 is formed by evaporation. A cathode (MgAg electrode) 551 and a protective electrode 552 are also formed by evaporation. Desirably, heat treatment is performed on the pixel electrode 547 to remove moisture completely from the electrode before forming the organic light emitting layer 550 and the cathode 551. Though the cathode of OLED is a MgAg electrode in this embodiment, other known materials may be used instead.

A known material can be used for the organic light emitting layer 550. For example, a low molecular weight organic EL material or a high molecular weight organic EL material can be used. The organic light emitting layer may be a thin film formed of a light emitting material that emits light from singlet excitation (fluorescence) (the material is called a singlet compound) or a light emitting material that emits light from triplet excitation (phosphorescence) (the material is called a triplet compound). In this embodiment, the organic light emitting layer has a two-layer structure consisting of a hole transporting layer and a light emitting layer. The organic light emitting layer may additionally have one or more layers out of a hole injection layer, an electron injection layer, and an electron transporting layer. Various combinations have been reported and the organic light emitting layer of this embodiment can take any of those.

The hole transporting layer of this embodiment is formed by evaporation from polyphenylene vinylene. The light emitting layer of this embodiment is formed by evaporation from polyvinyl carbazole with 30 to 40% of PBD, that is a 1,3,4-oxadiazole derivative, being molecule-dispersed. The light emitting layer is doped with about 1% of Coumarin 6 as green luminescent center.

The protective electrode 552 alone can protect the organic light emitting layer 550 from moisture and oxygen, but it is more desirable to add a protective film 553. This embodiment uses a silicon nitride film with a thickness of 300 nm as the protective film 553. The protective film and the protective electrode 552 may be formed in succession without exposing the device to the air.

The protective electrode 552 also prevents degradation of the cathode 551. A typical material of the protective electrode is a metal film mainly containing aluminum. Other materials may of course be used. Since the organic light emitting layer 550 and the cathode 551 are extremely weak against moisture, the organic light emitting layer, the cathode, and the protective electrode 552 are desirably formed in succession without exposing them to the air. The organic light emitting layer and the cathode are thus protected from the outside air.

The organic light emitting layer 550 is 10 to 400 nm in thickness (typically 60 to 150 nm), and the cathode 551 is 80 to 200 nm in thickness (typically 100 to 150 nm).

The passivation film 539 is effective in preventing moisture contained in the second interlayer insulating film 538 from seeping into the organic light emitting layer 550 through the pixel electrode 547 and the third interlayer insulating film 548 that are formed after the passivation film is formed.

Thus completed is an active matrix substrate structured as shown in FIG. 7B. An area 554 where the pixel electrode 547, the organic light emitting layer 550, and the cathode 551 overlap corresponds to the OLED.

In this embodiment, the anode serves as the pixel electrode while the cathode is laid on the organic light emitting layer. Therefore light from the OLED is emitted through the substrate to the outside. Alternatively, the cathode may serve as the pixel electrode while the anode is laid on the organic light emitting layer so that light is emitted in the direction reverse to the light emission direction of this embodiment.

The active matrix substrate shown in FIG. 7B may be applied to the substrate 401 of Embodiment 1 to complete an OLED module. Needless to say, the method of manufacturing the active matrix substrate of the present invention is not limited to the one described in this embodiment. The active matrix substrate of the present invention may be manufactured by a known method.

A p-channel TFT 560 and an n-channel TFT 561 are TFTs of the driving circuit and constitute a CMOS circuit. A switching TFT 562 and a driving TFT 563 are TFTs of the pixel portion. The TFTs of the driving circuit and the TFTs of the pixel portion can be formed on the same substrate.

In the case of a light-emitting device using the OLED of this embodiment, its driving circuit can be operated by a power supply having a voltage of about 5 to 6 V, 10 V, at most. Therefore degradation of TFTs due to hot electron is not a serious problem. Also, smaller gate capacitance is preferred for the TFTs since the driving circuit needs to operate at high speed. Accordingly, in a driving circuit of a light-emitting device using an OLED as in this embodiment, the second impurity region 529 and the fourth impurity region 533b of the semiconductor layers of the TFTs preferably do not overlap the gate electrode 518 and the gate electrode 519, respectively.

[Embodiment 3]

The light-emitting device is of the self-emission type, and thus exhibits more excellent recognizability of the displayed image in a light place as compared to the liquid crystal display device. Furthermore, the light-emitting device has a wider viewing angle. Accordingly, the light-emitting device can be applied to a display portion in various electronic devices.

Such electronic devices using a light-emitting device of the present invention include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIG. 8 respectively shows various specific examples of such electronic devices.

Figure 8A:
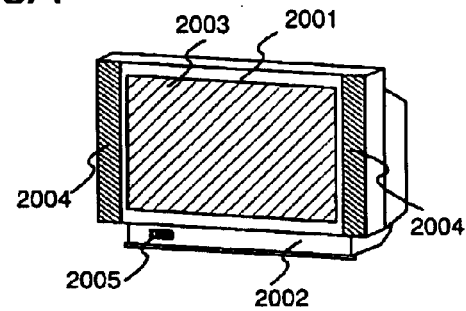
FIGS. 8A to 8H are diagrams showing examples of electronic equipment.

FIG. 8A illustrates an organic light emitting display device which includes a casing 2001, a support table 2002, a display portion 2003, a speaker portion 2004, a video input terminal 2005 or the like. The present invention is applicable to the display portion 2003. The light-emitting device is of the self-emission type and therefore requires no back light. Thus, the display portion thereof can have a thickness thinner than that of the liquid crystal display device. The organic light emitting display device is including all of the display device for displaying information, such as a personal computer, a receiver of TV broadcasting and an advertising display.

Figure 8B:
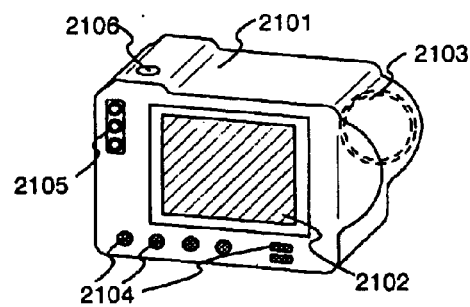

FIG. 8B illustrated a digital still camera which includes a main body 2101, a display portion 2102, an image receiving portion 2103, an operation key 2104, an external connection port 2105, a shutter 2106, or the like. The light-emitting device in accordance with the present invention can be used as the display portion 2102.

Figure 8C:
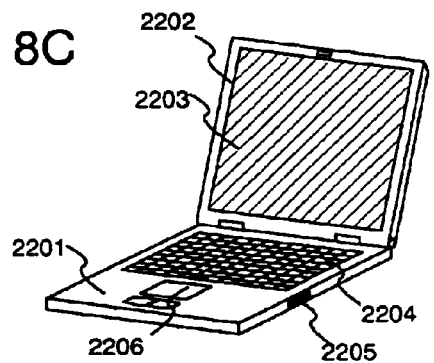

FIG. 8C illustrates a laptop computer which includes a main body 2201, a casing 2202, a display portion 2203, a keyboard 2204, an external connection port 2205, a pointing mouse 2206, or the like. The light-emitting device in accordance with the present invention can be used as the display portion 2203.

Figure 8D:
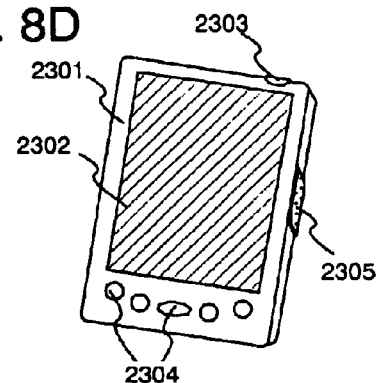

FIG. 8D illustrated a mobile computer which includes a main body 2301, a display portion 2302, a switch 2303, an operation key 2304, an infrared port 2305, or the like. The light-emitting device in accordance with the present invention can be used as the display portion 2302.

Figure 8E:
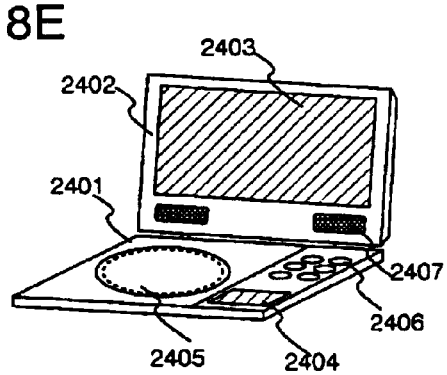

FIG. 8E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device in accordance with the present invention can be used as these display portions A and B. The image reproduction apparatus including a recording medium further includes a game machine or the like.

Figure 8F:
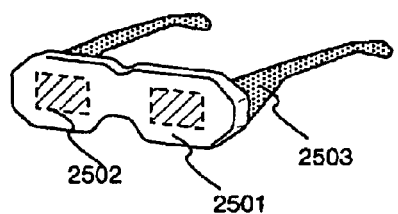

FIG. 8F illustrates a goggle type display (head mounted display) which includes a main body 2501, a display portion 2502, an arm portion 2503. The light-emitting device in accordance with the present invention can be used as the display portion 2502.

Figure 8G:
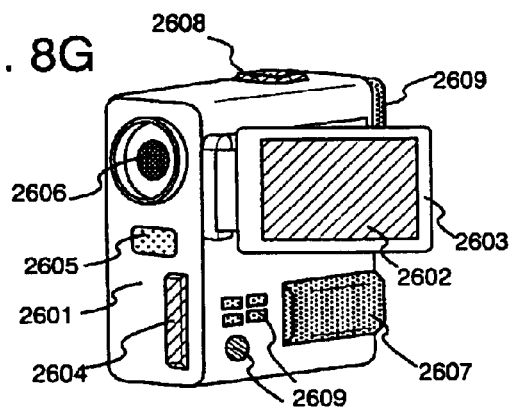

FIG. 8G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light-emitting device in accordance with the present invention can be used as the display portion 2602.

Figure 8H:
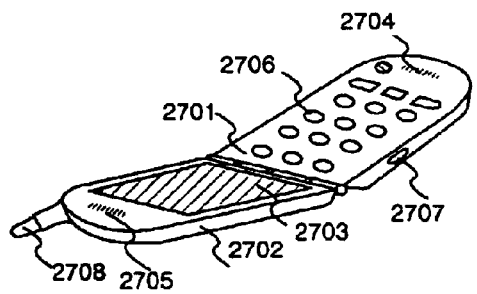

FIG. 8H illustrates a mobile phone which includes a main body 2701, a casing 2702, a display portion 2703, a sound input portion 2704, a sound output portion 2705, an operation key 2706, an external connecting port 2707, an antenna 2708, or the like. The light-emitting device in accordance with the present invention can be used as the display portion 2703. Note that the display portion 2703 can reduce power consumption of the portable telephone by displaying white-colored characters on a black-colored background.

When the brighter luminance of light emitted from the organic light emitting material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic light emitting material can exhibit high response speed.

A portion of the light-emitting device that is emitting light consumes power, so it is desirable to display information in such a manner that the light emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a light-emitting device having the configuration in Embodiments 1 or 2.

[Embodiment 4]

The example shown in Embodiment Mode 1 is of forming the DLC film by plasma CVD. This embodiment shows an example of forming on the wrapping film by sputtering a silicon nitride film containing Ar, an Ar-containing film of a compound expressed as $AlN_XO_Y$, an AlN film containing Ar, or a laminate of these films. The description is given with reference to FIG. 9. Here, an Ar-containing film of a compound expressed as $AlN_XO_Y$ is used to provide the inside of a wrapping film shaped like a sack or an empty box.

A chamber 901 connected to the earth is exhausted to reach vacuum and oxygen gas and inert gas (Ar gas or nitrogen gas) is introduced into the chamber. Then a film 906 of a compound expressed as $AlN_XO_Y$ (the films is called an $AlN_XO_Y$ film) with a rare gas element contained therein is formed and used to provide the inside of a wrapping film 905. The wrapping film 905 is fixed by a holder 907 between a target electrode 903 and the chamber 901. The target electrode 903 is connected to an RF power supply 904 and formed of AlN. Note that the outside of the wrapping film 905 is not provided with the $AlN_XO_Y$ film.

The wrapping film 905 that is provided with the $AlN_XO_Y$ film 906 containing rare gas is thermally press-fit in vacuum to seal the light-emitting device. By containing the rare gas, the film can be flexible and therefore can be prevented from developing a crack when used to provide the wrapping film and thermally press-fit in vacuum.

If an AlN film is formed instead, inert gas (Ar gas or nitrogen gas) is introduced into the chamber and a target electrode formed of AlN and connected to the RF power supply is used. If a silicon nitride film is formed instead, nitrogen gas and Ar gas are introduced into the chamber and a target electrode formed of Si and connected to the RF power supply is used.

Although the wrapping film 905 shown here is like a sack or an empty box, the wrapping film may be composed of two sheets laid on top of each other and the four sides thereof are all press-fit. The material usable as the wrapping film 905 is a resin material (polyester, polycarbonate, polypropylene, polyvinyl chloride, polystyrene, polyacrylonitrile, polyethylene terephthalate, nylon, etc.). Typically, thermoplastic, a PVF (polyvinyl fluoride) film, a Mylar film, or an acrylic resin film is used.

Figure 9:
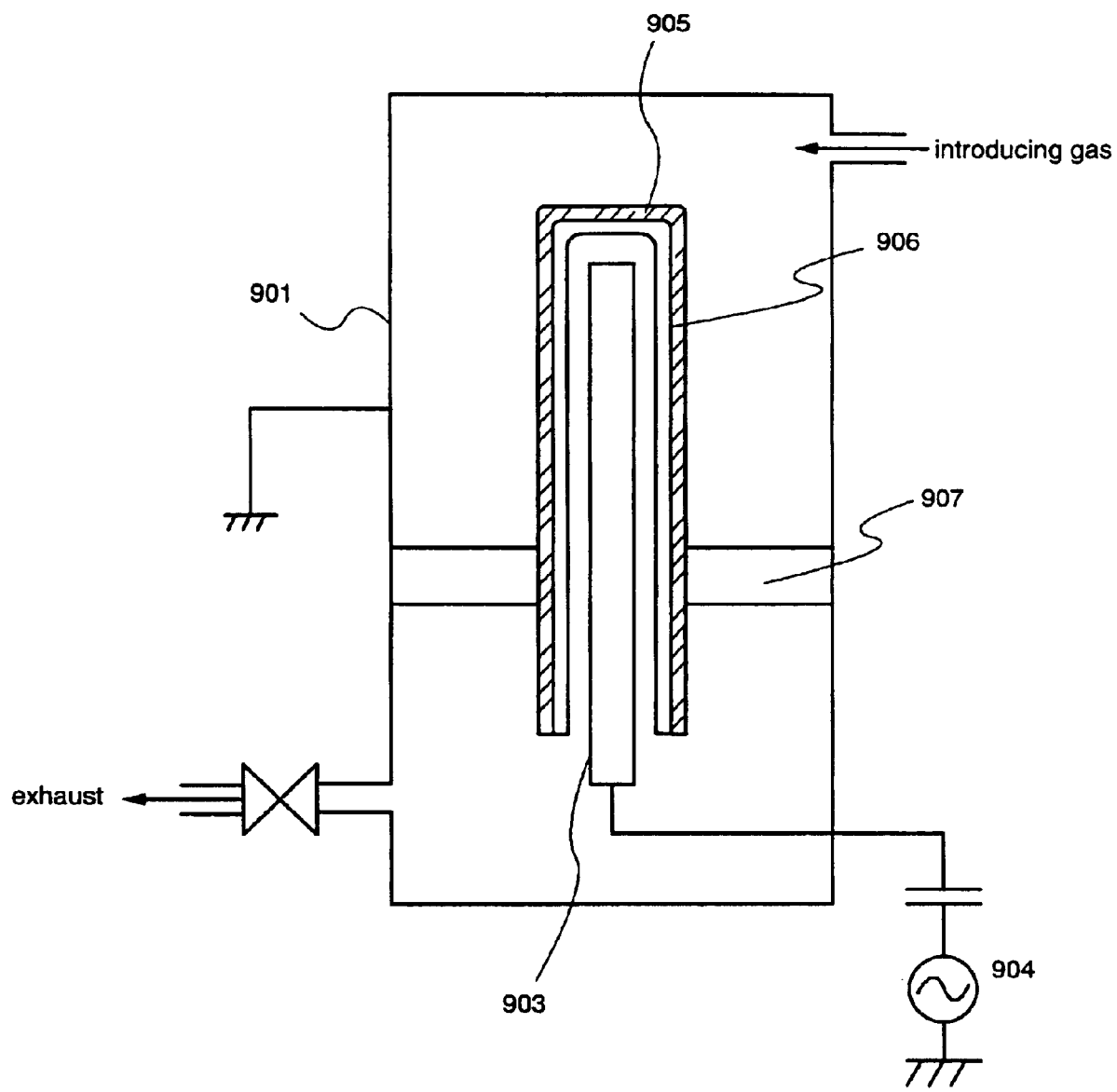
FIG. 9 is a diagram showing a film forming apparatus that uses sputtering.

The target electrode shown in FIG. 9 is rod-like (cylinder-like or prism-like) but, needless to say, the shape of the target electrode is not particularly limited. The target electrode is shaped in accordance with the shape of the object to be processed since the distance between the target electrode and the inner surface of the object to be processed is preferably kept constant.

Figure 10:
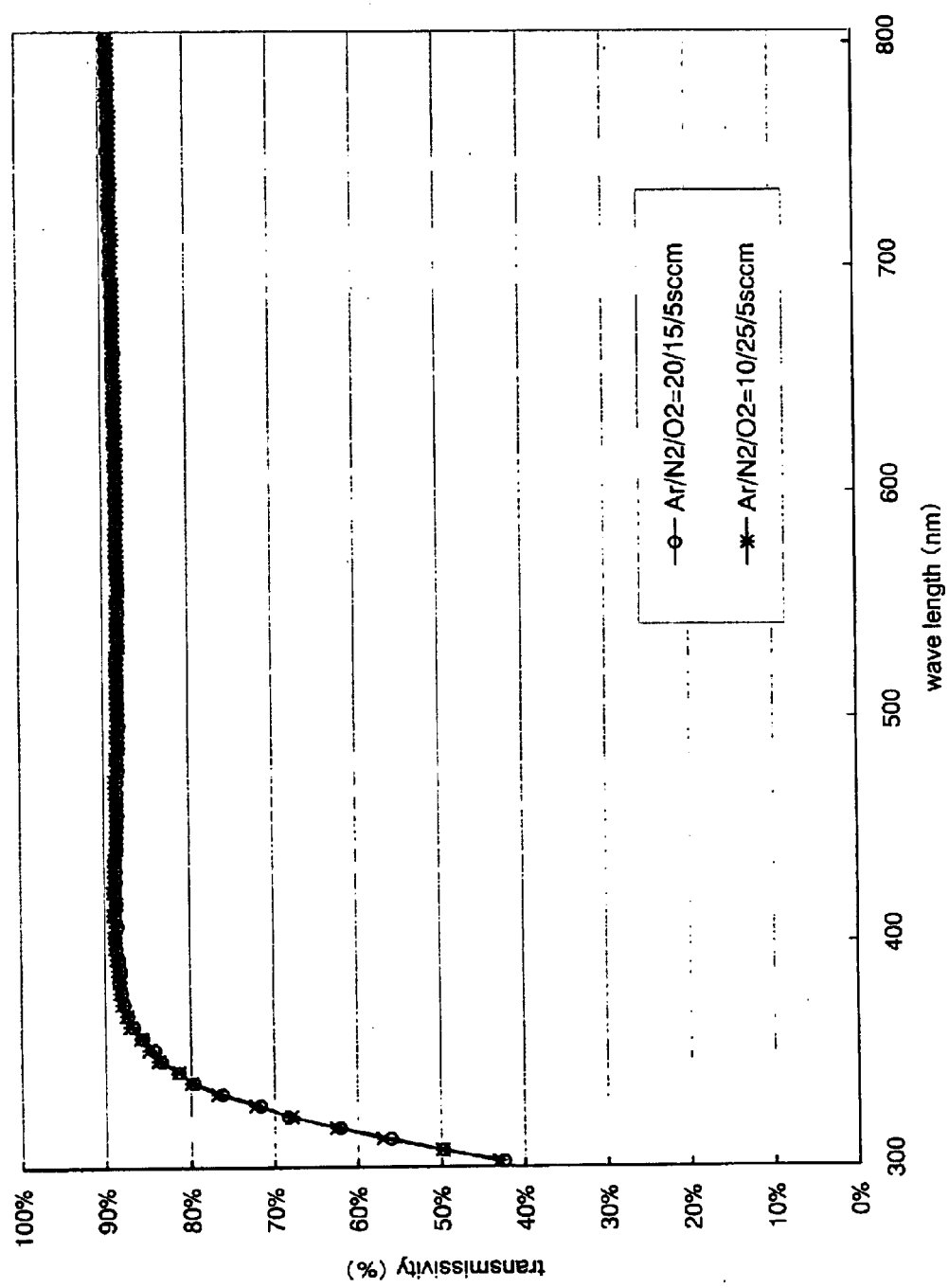
FIG. 10 is a graph showing the transmissivity of an $AlN_XO_Y$ (X<Y) film.

The transmissivity of a $AlN_XO_Y$ film (X<Y) having a thickness of 100 nm is shown in FIG. 10. FIG. 10 shows that the $AlN_XO_Y$ film has a transmissivity of 80 to 90% in visible light range and is highly transmissive of light. The $AlN_XO_Y$ (X<Y) film contains 0.1 atomic % of rare gas element or higher, preferably 1 to 30 atomic %, and contains several atomic % of nitrogen or higher, preferably, 2.5 to 47.5 atomic %. The film preferably contains 2.5 to 47.5 atomic % of oxygen. The nitrogen concentration and oxygen concentration of the film can be controlled by suitably adjusting sputtering conditions (the substrate temperature, the type of gas introduced and the flow rate thereof, film formation pressure, etc.).

If the sputtering conditions, for example, the flow rate of the gas introduced, are changed, an $AlN_XO_Y$ (X≧Y) film can be obtained. A $AlN_XO_Y$ (X<Y) film or $AlN_XO_Y$ (X≧Y) film that has a nitrogen or oxygen concentration gradient in the direction of the film thickness may also be formed.

Figure 11:
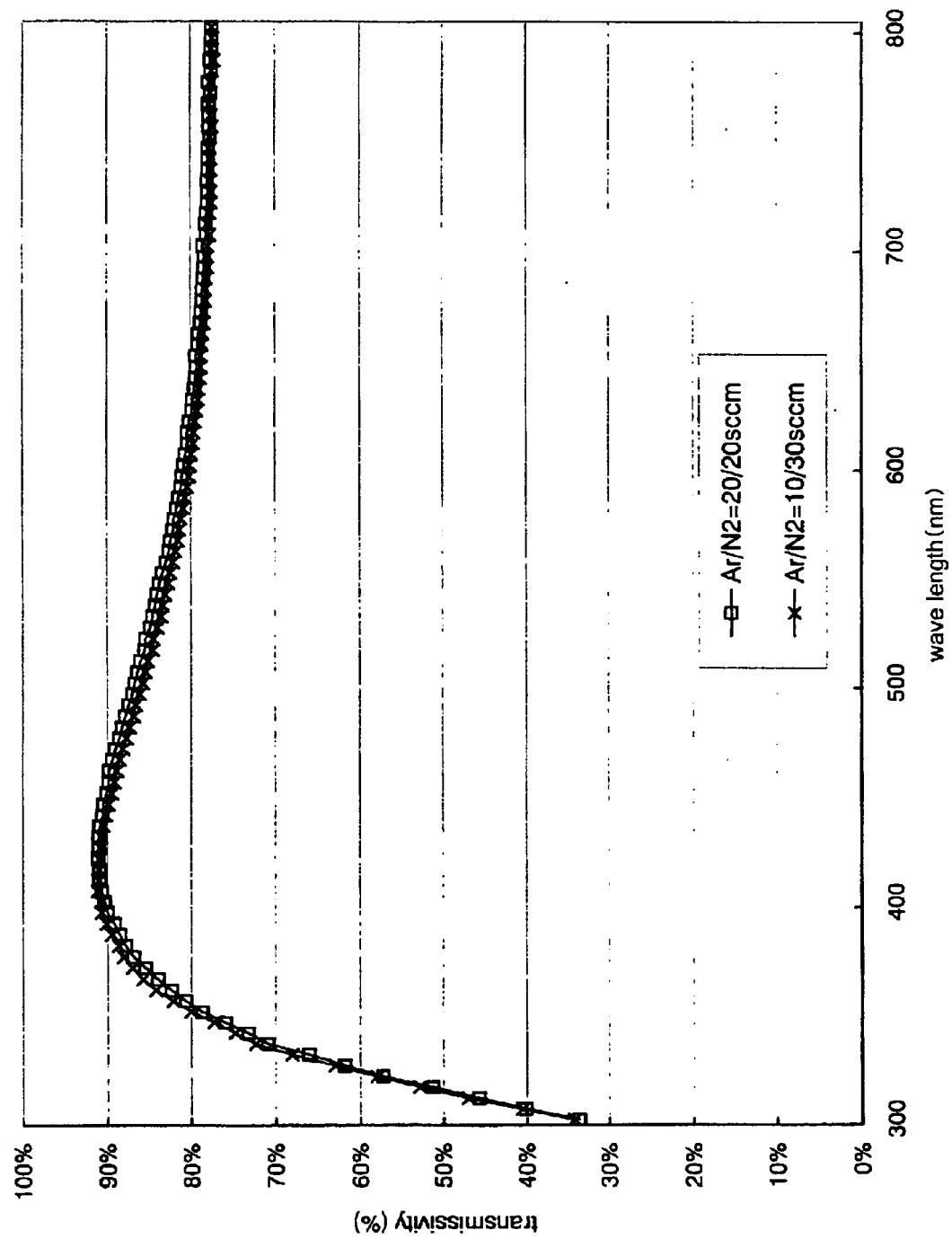
FIG. 11 is a graph showing the transmissivity of an AlN film.

FIG. 11 shows the transmissivity of an AlN film (also expressed as $Al_XN_Y$ film) having a thickness of 100 nm. Although this film has an average transmissivity lower than that of the $AlN_XO_Y$ film (X<Y) shown in FIG. 10, the transmissivity thereof in visible light range is 80 to 91.3% and is high enough. The acceptable range for the concentration of impurities, oxygen, in particular, contained in the $Al_XN_Y$ film is less than 0 to 10 atomic %. The oxygen concentration can be controlled by adjusting sputtering conditions (the substrate temperature, the type of gas introduced, the flow rate thereof, the film formation pressure, etc.) appropriately. The $Al_XN_Y$ film contains 0.1 atomic % of rare gas element or higher, preferably 1 to 30 atomic %, and contains several atomic % of nitrogen or higher, preferably, 2.5 to 47.5 atomic %. The film also contains 47.5 atomic % of oxygen or lower, preferably, equal to or higher than 0 atomic % and less than 10 atomic %.

If the sputtering conditions, for example, the flow rate of the gas introduced, are changed, an $Al_XN_Y$ film that has a nitrogen or oxygen concentration gradient in the direction of the film thickness may also be formed.

The following experiment has been conducted.

A polycarbonate (PC) film is provided with an Ar-containing AlN film with a thickness of 200 nm on one side. Another polycarbonate (PC) film is provided with an Ar-containing $AlN_XO_Y$ film with a thickness of 200 nm on one side. Each of the films is bonded to a sealing can while putting calcium oxide as a desiccant in the space between the film and the sealing can. The thus prepared samples are let stand at room temperature for a long time and a change in weight is examined. If there is a change in weight, it can be deduced that moisture or the like is adsorbed by the calcium oxide through the PC films. As a control subject, a sample is prepared by bonding a polycarbonate (PC) film alone to a sealing can and placing calcium oxide between the film and the can. The results (transmissivity) of the experiment are shown in FIG. 12.

Figure 12:
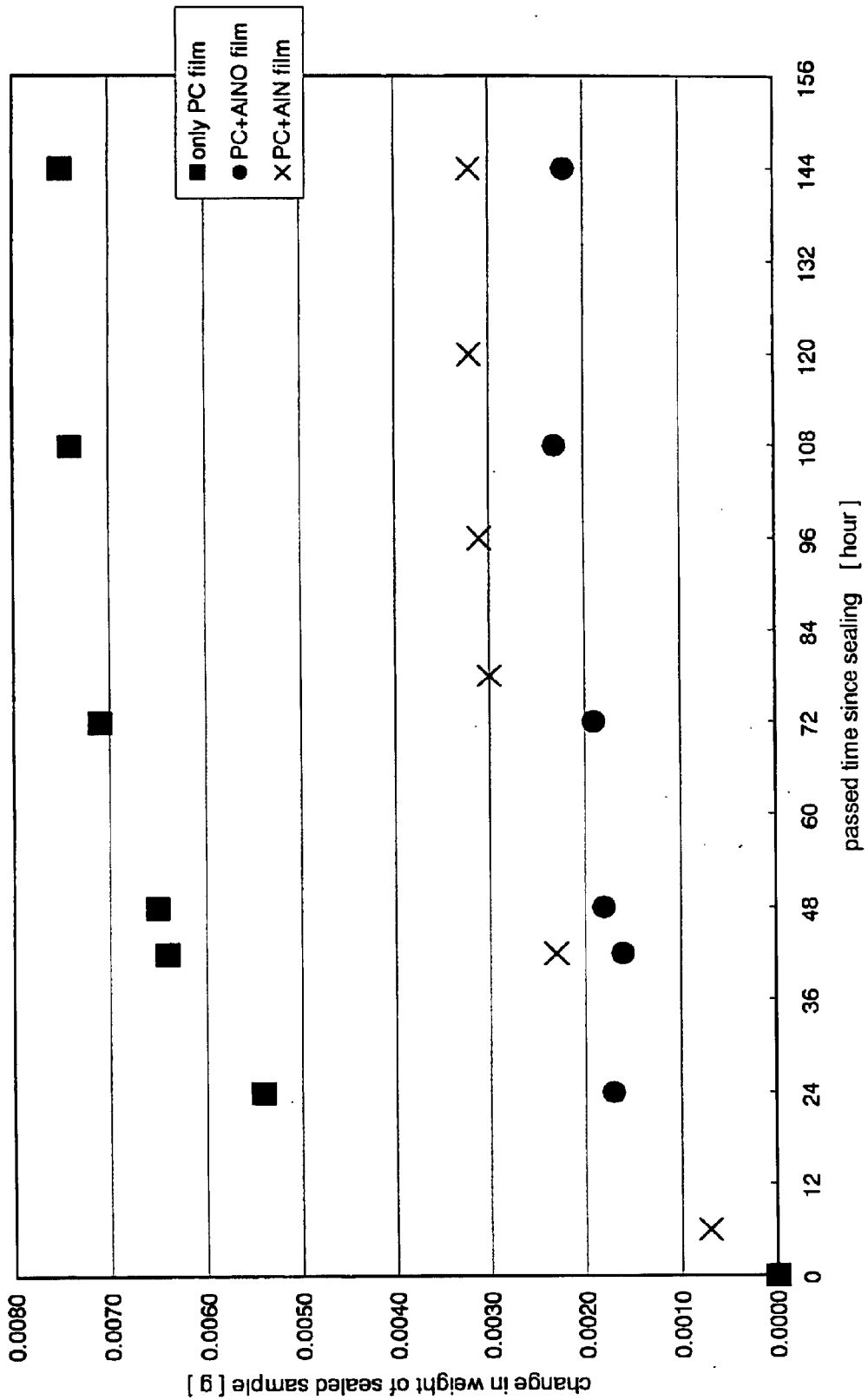
FIG. 12 is a graph showing the moisture permeability of various kinds of films.

As shown in FIG. 12, the weight of the sample with the AlN film and the weight of the sample with the $AlN_XO_Y$ film change less than the control subject, i.e., the polycarbonate (PC) film alone. Accordingly, it can be concluded that the moisture resistance of a PC film is improved by lining the PC film with an AlN film or an $AlN_XO_Y$ film.

This embodiment may be combined with any of Embodiment Mode 2 and Embodiments 1 through 3.

The present invention seals the entire substrate in vacuum on which an OLED is formed using a film that is provided with a flexible DLC film, silicon nitride film, $AlN_XO_Y$ film, or AlN film on one side (inside or outside). The effect of preventing degradation of the OLED due to steam or oxygen can thus be increased and the stability of the OLED can be enhanced. Accordingly, a highly reliable light-emitting device can be obtained.

What is claimed is:

1. A light-emitting device comprising:

an active matrix substrate over which a light emitting element having a thin film transistor is formed;

a desiccant; and a protective unit wrapping the active matrix substrate, wherein the protective unit comprises a film, and wherein both sides of the film are covered with a thin film comprising a rare gas element and a carbon.

2. A light-emitting device according to claim 1, wherein the light emitting element has an anode, a cathode, and an EL material interposed therebetween.

3. A light-emitting device according to claim 1, wherein the protective unit is brought into contact with the active matrix substrate by vacuum press-fitting.

4. A light-emitting device according to claim 1, wherein the thin film containing carbon is a DLC film.

5. A light-emitting device according to claim 1, wherein the rare gas element is one or plural kinds of elements selected from the group consisting of He, Ne, Ar, Kr, and Xe.

6. A light-emitting device according to claim 1, wherein the desiccant is at least one of barium oxide and calcium oxide.

7. A light-emitting device according to claim 1, wherein the light-emitting device is at least one selected from the group consisting of an organic light-emitting display device, a digital camera, a personal computer, a mobile computer, an image reproduction apparatus, a goggle type display, a video camera, and a mobile phone.

8. A light-emitting device comprising:

an active matrix substrate over which a light emitting element having a thin film transistor is formed;

a desiccant; and a protective unit wrapping the active matrix substrate, wherein the protective unit comprises a film at least partially provided with a silicon oxynitride film containing a rare gas element.

9. A light-emitting device according to claim 8, wherein the desiccant is at least one of barium oxide and calcium oxide.

10. A light-emitting device according to claim 8, wherein the light-emitting device is at least one selected from the group consisting of an organic light-emitting display device, a digital camera, a personal computer, a mobile computer, an image reproduction apparatus, a goggle type display, a video camera, and a mobile phone.

11. A light-emitting device comprising:

an active matrix substrate over which a light emitting element having a thin film transistor is formed;

a desiccant; and a protective unit wrapping the active matrix substrate, wherein the protective unit comprises a film and wherein both sides of the film are covered with a silicon nitride film containing a rare gas element.

12. A light-emitting device according to claim 11, wherein the desiccant is at least one of barium oxide and calcium oxide.

13. A light-emitting device according to claim 11, wherein the light-emitting device is at least one selected from the group consisting of an organic light-emitting display device, a digital camera, a personal computer, a mobile computer, an image reproduction apparatus, a goggle type display, a video camera, and a mobile phone.

14. A light-emitting device comprising:

an active matrix substrate over which a light emitting element having a thin film transistor is formed;

a desiccant; and a protective unit wrapping the active matrix substrate, wherein the protective unit comprises a film at least partially provided with an $AlN_xO_y$ film containing a rare gas element.

15. A light-emitting device according to claim 14, wherein the desiccant is at least one of barium oxide and calcium oxide.

16. A light-emitting device according to claim 14, wherein the light-emitting device is at least one selected from the group consisting of an organic light-emitting display device, a digital camera, a personal computer, a mobile computer, an image reproduction apparatus, a goggle type display, a video camera, and a mobile phone.

17. A light-emitting device comprising:

an active matrix substrate over which a light emitting element having a thin film transistor is formed;

a desiccant; and a protective unit wrapping the active matrix substrate, wherein the protective unit comprises a film and wherein both sides of the film are covered with an AlN film containing a rare gas element.

18. A light-emitting device according to claim 17, wherein the desiccant is at least one of barium oxide and calcium oxide.

19. A light-emitting device according to claim 17, wherein the light-emitting device is at least one selected from the group consisting of an organic light-emitting display device, a digital camera, a personal computer, a mobile computer, an image reproduction apparatus, a goggle type display, a video camera, and a mobile phone.

20. A light-emitting device comprising:

a substrate over which a light emitting element is formed;

a desiccant; and a protective unit wrapping the substrate, wherein the protective unit comprises a film and wherein both sides of the film are covered with a thin film comprising a rare gas element and an inorganic material.

21. A light-emitting device according to claim 20, wherein the rare gas element is one or plural kinds of elements selected from the group consisting of He, Ne, Ar, Kr, and Xe.

22. A light-emitting device according to claim 20, wherein the desiccant is at least one of barium oxide and calcium oxide.

23. A light-emitting device according to claim 20, wherein the light-emitting device is at least one selected from the group consisting of an organic light-emitting display device, a digital camera, a personal computer, a mobile computer, an image reproduction apparatus, a goggle type display, a video camera, and a mobile phone.

* * * * *